United States Patent
Jeon et al.

(10) Patent No.: US 11,999,245 B2
(45) Date of Patent: Jun. 4, 2024

(54) DIAGNOSIS APPARATUS FOR DIAGNOSING A COMMUNICATION STATE BETWEEN A VEHICLE INCLUDING A BATTERY AND A BATTERY MANAGEMENT SYSTEM CONNECTED TO A VEHICLE

(71) Applicant: LG Chem, Ltd., Seoul (KR)

(72) Inventors: Dae Gon Jeon, Daejeon (KR); Jang Hyeok Choi, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 604 days.

(21) Appl. No.: 17/279,921

(22) PCT Filed: Jan. 14, 2020

(86) PCT No.: PCT/KR2020/000674
§ 371 (c)(1),
(2) Date: Mar. 25, 2021

(87) PCT Pub. No.: WO2020/149611
PCT Pub. Date: Jul. 23, 2020

(65) Prior Publication Data
US 2021/0344580 A1    Nov. 4, 2021

(30) Foreign Application Priority Data
Jan. 14, 2019    (KR) .......................... 10-2019-0004837

(51) Int. Cl.
*B60L 3/04*        (2006.01)
*B60L 58/10*       (2019.01)
(Continued)

(52) U.S. Cl.
CPC ................. *B60L 3/04* (2013.01); *B60L 58/10* (2019.02); *H04L 43/0823* (2013.01); *H04L 67/12* (2013.01)

(58) Field of Classification Search
CPC ......................................................... B60L 3/04
(Continued)

(56) References Cited

U.S. PATENT DOCUMENTS 6,456,085 B1 * 9/2002 Dietl .................. G01R 31/2829
324/509
8,954,220 B2 * 2/2015 Kubo ..................... B60L 58/24
701/29.2

(Continued)

FOREIGN PATENT DOCUMENTS

| EP | 2085784 A2 | 8/2009 |
|----|-----------|--------|
| JP | 2531826 B2 | 9/1996 |

(Continued)

OTHER PUBLICATIONS

Search Report for European Application No. 20741735.3 dated Aug. 30, 2021. 2 pgs.

(Continued)

*Primary Examiner* — Jerry D Robbins
(74) *Attorney, Agent, or Firm* — Lerner David LLP (57) ABSTRACT

A diagnosis apparatus includes a vehicle including a battery and a BMS connected to the vehicle. The vehicle is configured to generate a signal having a predetermined period and a predetermined width, and the BMS is configured to diagnose a communication state between the vehicle and the BMS and a state of the battery based on the signal, and to determine the communication state and the state of the battery as a normal state when a period of the signal is the same as a reference period and a width of the signal is the same as a reference width.

16 Claims, 10 Drawing Sheets

(51) Int. Cl.
    *H04L 43/0823*     (2022.01)
    *H04L 67/12*     (2022.01)

(58) Field of Classification Search
    USPC .......................................................... 320/134
    See application file for complete search history.

(56) References Cited

U.S. PATENT DOCUMENTS

| | | | | |
|---|---|---|---|---|
| 9,929,570 | B2* | 3/2018 | Ishibashi | ............... H02J 7/00 |
| 2013/0020978 | A1* | 1/2013 | Yamada | ............ G06F 11/0739 |
| | | | | 700/79 |
| 2013/0099748 | A1* | 4/2013 | Shimizu | ............ H02J 7/0048 |
| | | | | 324/426 |
| 2013/0099793 | A1* | 4/2013 | Shimizu | ............ H02J 7/005 |
| | | | | 324/426 |
| 2013/0338871 | A1* | 12/2013 | Kubo | ............ B60L 58/18 |
| | | | | 701/29.2 |
| 2014/0210638 | A1* | 7/2014 | Gussen | ............ B60L 58/14 |
| | | | | 340/870.09 |
| 2018/0278066 | A1* | 9/2018 | Kurahashi | ............ B60L 3/04 |
| 2018/0337431 | A1* | 11/2018 | James | ............ H01G 9/0003 |

FOREIGN PATENT DOCUMENTS

| | | |
|---|---|---|
| JP | 2011257154 A | 12/2011 |
| JP | 2012143048 A | 7/2012 |
| JP | 2013102572 A | 5/2013 |
| KR | 20050098635 A | 10/2005 |
| KR | 20150018993 A | 2/2015 |
| KR | 20160066345 A | 6/2016 |
| KR | 20180067129 A | 6/2018 |
| WO | 2010137076 A1 | 12/2010 |
| WO | 2018217584 A1 | 11/2018 |

OTHER PUBLICATIONS

International Search Report for Application No. PCT/KR2020/000674, dated Apr. 29, 2020, 3 pages.

* cited by examiner

DIAGNOSIS APPARATUS FOR DIAGNOSING A COMMUNICATION STATE BETWEEN A VEHICLE INCLUDING A BATTERY AND A BATTERY MANAGEMENT SYSTEM CONNECTED TO A VEHICLE

CROSS-REFERENCE TO RELATED APPLICATION(S)

The present application is a national phase entry under 35 U.S.C. § 371 of International Application No. PCT/KR2020/000674 filed Jan. 14, 2020, published in Korean, which claims priority from Korean Patent Application No. 10-2019-0004837 filed Jan. 14, 2019, all of which are incorporated herein by reference.

TECHNICAL FIELD

The present invention relates to a diagnosis apparatus, and more particularly, to a diagnosis apparatus that diagnoses a communication state between a battery management system (BMS) and a vehicle and a battery state of a system by using a universal asynchronous receiver/transmitter (UART) signal.

BACKGROUND ART

A universal asynchronous receiver/transmitter (UART) is a type of computer or peripheral device that is a separate integrated circuit that communicates by serializing parallel data. Since it performs asynchronous communication, a synchronous signal is not transmitted. Therefore, a synchronization signal is detected at a receiving side to temporally process a start and end of data. A digital circuit classifies a section of a bit from received data at a predetermined speed by using its own clock signal, and determines a logical state of the bit to perform data communication.

Generally, a vehicle diagnostic module is a device for self-diagnosing and recording various abnormal conditions occurring while a vehicle is being driven, and self-diagnostic information recorded in the vehicle diagnostic module is analyzed for an abnormality of the vehicle through an external analysis device.

The vehicle diagnostic information is transmitted and received through a UART. The UART is a type of computer hardware that converts parallel data to serial data and transmits the data. The UART is generally used with communication standards such as EIA RS-232, RS-422, and RS-485. "U" of the UART stands for a universal purpose, which means that a data type or baud rate may be directly configured, and that an actual electrical signal level and method (for example, a differential signal) is usually managed through a specific driver circuit outside the UART.

Conventionally, in order to diagnose a state of a battery installed in a vehicle by using the vehicle diagnostic information, an additional circuit and an additional microcontroller unit (MCU) must be applied, and thus, costs increase.

SUMMARY

Technical Problem

The present invention has been made in an effort to provide a diagnosis apparatus that may diagnose a communication state between a BMS and a vehicle and a battery state of a vehicle by using a UART signal.

In addition, the present invention has been made in an effort to provide a diagnosis apparatus that may reduce costs since there is no need to configure an additional circuit for diagnosis.

The technical objects of the present invention are not limited to those stated above, and other non-mentioned objects will be clearly understood by a person of ordinary skill in the art by way of the following description.

Technical Solution

An embodiment provides a diagnosis apparatus for diagnosing a communication state between a vehicle including a battery and a battery management system (BMS) connected to the vehicle, wherein the diagnosis apparatus is included in the BMS and includes a controller configured to: receive, from the vehicle, a signal; compare a period of the received signal to a predetermined reference period; compare a width of the received signal to a predetermined reference width; and determine a communication state and a state of the battery based on the compared period and width of the signal, wherein, in response to the period of the signal being the same as the reference period and the width of the signal being the same as a reference width, the controller is configured to determine the communication state to be a normal communication state and the state of the battery to be a normal battery state.

the width of the signal being the same as the reference width and the period of the signal being not the same as the reference period, the controller is configured to determine the communication state to be a disconnected communication state in which communication between the vehicle and the BMS is disconnected.

In response to the width of the signal being the same as the reference width and the period of the signal being longer that the reference period, the controller is configured to determine the communication state to be the disconnected communication state.

In response to the width of the signal being the same as the reference width and the period of the signal being shorter that the reference period, the controller is configured to determine the communication state to be the disconnected communication state.

In response to the width of the signal being wider than the reference width and the period of the signal being the same as the reference period, the controller is configured to determine the state of the battery to be a short-to-battery state.

In response to the width of the signal being wider than the reference width and the period of the signal being longer than the reference period, the controller is configured to determine the state of the battery to be a short-to-battery state In response to the width of the signal being wider than the reference width and the period of the signal being shorter than the reference period, the controller is configured to determine the state of the battery to be a short-to-battery state.

In response to the width of the signal being narrower than the reference width and the period of the signal being the same as the reference period, the controller is configured to determine the state of the battery to be a short-to-ground state.

In response to the width of the signal being narrower than the reference width and the period of the signal being longer than the reference period, the controller is configured to determine the state of the battery to be a short-to-ground state.

In response to the width of the signal being narrower than the reference width and the period of the signal being shorter than the reference period, the controller is configured to determine the state of the battery to be a short-to-ground state.

The signal is a universal asynchronous receiver/transmitter (UART) signal.

Another embodiment provides a diagnosis system including the diagnosis apparatus of any of the embodiments described herein, and a BMS, wherein the diagnosis apparatus is included in the BMS.

The BMS further includes a comparator connected to an output terminal of the vehicle to receive the signal and to an input terminal of the controller to transmit the signal, wherein an output of the comparator is held at a reference voltage through a first pull-up resistor, a negative input electrode of the comparator is held at the reference voltage through a second pull-up resistor and connected to ground through a third resistor, and a positive input electrode of the comparator is held at the reference voltage through a fourth pull-up resistor.

The BMS further includes a filter connected between the output terminal of the vehicle and the positive input electrode of the comparator.

The filter includes a fifth resistor; and a capacitor connected to ground, wherein the filter is configured to remove noise from the signal.

Yet another embodiment provides a system including a vehicle including a battery; and the diagnosis system of any of the embodiments described herein, wherein the BMS of the diagnosis system is connected to the vehicle.

Advantageous Effects

According to the vehicle diagnosis apparatus of the present invention, it is possible to effectively diagnose a communication state between a BMS and a vehicle and a battery state of the vehicle by using only a UART signal.

In addition, since there is no need to configure an additional circuit for diagnosis, it is possible to effectively reduce costs.

DETAILED DESCRIPTION

Hereinafter, embodiments disclosed in the present specification will be described in detail with reference to the accompanying drawings. In the present specification, the same or similar constituent elements will be denoted by the same or similar reference numerals, and an overlapped description thereof will be omitted. The terms "module" and "unit" or "part" representing constituent elements used in the following description are used only in order to make understanding of the specification easier. Therefore, these terms do not have meanings or roles that distinguish them from each other by themselves. In addition, in describing exemplary embodiments of the present specification, when it is determined that a detailed description of the well-known art associated with the present invention may obscure the gist of the present invention, it will be omitted. Further, the accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various constituent elements, and are not to be interpreted as limiting these constituent elements. The terms are only used to differentiate one constituent element from other constituent elements.

It is to be understood that when one constituent element is referred to as being "connected" or "coupled" to another constituent element, it may be connected or coupled directly to the other constituent element or be connected or coupled to the other constituent element with a further constituent element intervening therebetween. On the other hand, it is to be understood that when one constituent element is referred to as being "connected or coupled directly" to another constituent element, it may be connected to or coupled to the other constituent element without another constituent element intervening therebetween.

Singular forms are intended to include plural forms unless the context clearly indicates otherwise.

It will be further understood that terms "comprises" or "have" used in the present specification specify the presence of stated features, numerals, steps, operations, constituent elements, parts, or a combination thereof, but do not preclude the presence or addition of one or more other features, numerals, steps, operations, constituent elements, parts, or combinations thereof.

Figure 1:
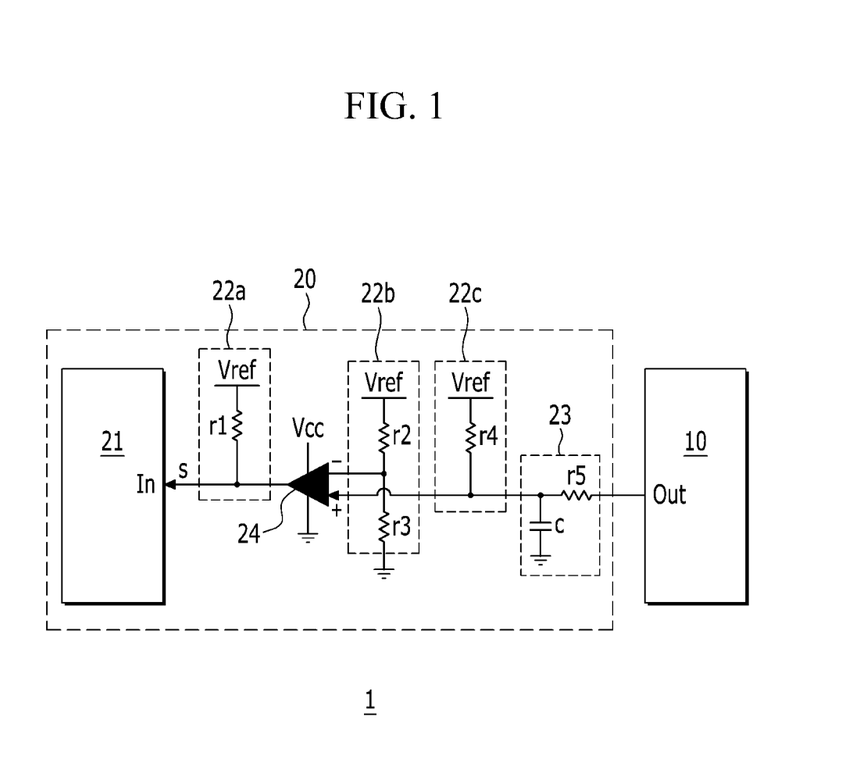
FIG. 1 illustrates a block diagram of a diagnosis apparatus according to an embodiment.

Hereinafter, a diagnosis apparatus according to an embodiment will be described with reference to FIG. 1. FIG. 1 illustrates a block diagram of a diagnosis apparatus according to an embodiment.

Referring to FIG. 1, a diagnosis apparatus 1 includes a vehicle 10 and a BMS 20.

The vehicle 10 may be a system (for example, an electric vehicle) including a battery, and the battery may be a secondary battery, but embodiments are not limited thereto.

The vehicle 10 includes an output terminal (out), and an asynchronous unidirectional UART communication signal (hereinafter referred to as a signal) is outputted from the output terminal. When the vehicle 10 collides, a width and/or period of a signal may be changed compared to that of a signal in a state (hereinafter referred to as a normal state) in which the vehicle 10 does not collide.

The BMS 20 is wired/wirelessly connected to the vehicle 10, and may diagnose a communication state between the vehicle 10 and the BMS 20 and a state of a battery included in the vehicle 10 (not shown, hereinafter referred to as a battery) by using a signal occurring when the vehicle 10 collides.

That is, the BMS 20 may diagnose whether a communication state between the vehicle 10 and the BMS 20 is normal or is a loss of communication (LOC) state (hereinafter referred to as a first state) and whether it is stuck high (hereinafter referred to as a second state) or stuck close (hereinafter referred to as a third state), by using a changed width and/or a changed period of the signal compared to a normal signal.

The BMS 20 may include an MCU 21, a plurality of pull-up parts 22a, 22b, and 22c, a comparator 24, and a filter 23.

The MCU 21 includes an input terminal (in), and may diagnose a communication state between the vehicle 10 and the BMS 20 and a battery state by using a signal (s) inputted to the input terminal (in). A specific operation of the MCU 21 performing the diagnosis will be described later.

The pull-up part 22a includes a pull-up resistor r1, and serves to hold an output voltage of the comparator 24 as a reference voltage Vref.

The pull-up part 22b includes a pull-up resistor r2 and a resistor r3, and serves to hold an input voltage of a negative electrode (−) of the comparator 24 as the reference voltage Vref.

The pull-up part 22c includes a pull-up resistor r4, and serves to hold an input voltage of a positive electrode (+) of the comparator 24 as the reference voltage Vref.

The filter 23 includes a resistor r5 and a capacitor (c), and removes noise from a signal of the vehicle 10. The filter 23 of FIG. 1 is an example, and the filter 23 of embodiments is not limited thereto.

The comparator 24 includes a negative electrode (−) to which the reference voltage is inputted and a positive electrode (+) to which a signal is inputted, and operates through a driving voltage Vcc.

Hereinafter, a configuration in which the MCU 21 diagnoses the communication state between the vehicle 10 and the BMS 20 and the state of the battery by using the signal (s) will be described in detail with reference to FIG. 2 to FIG. 5.

Figure 2:
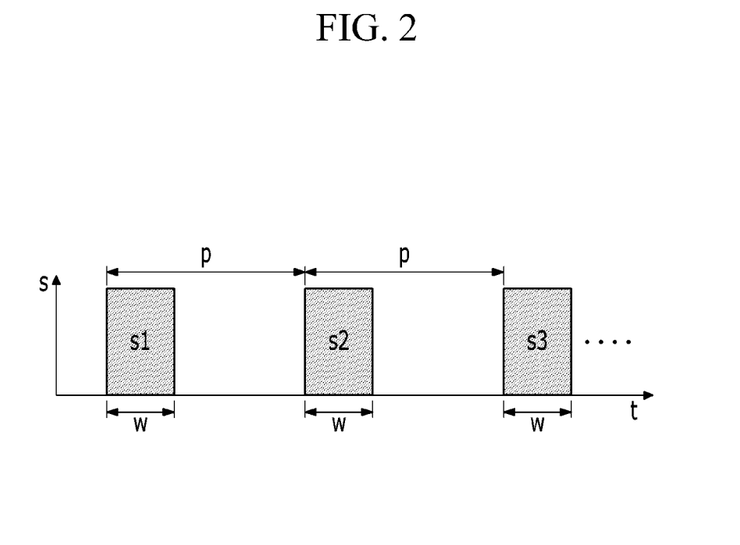
FIG. 2 illustrates a signal that may be diagnosed in a normal state according to an embodiment.

Referring to FIG. 2, the signal (s) includes a plurality of signals s1, s2, and s3, and each signal has a reference period (p) and a reference width (w).

Referring to FIG. 2, all of the plurality of signals s1, s2, and s3 have the predetermined reference period (p) (for example, 300 ms to 700 ms) and the predetermined reference width (w) (for example, 100 ms).

When a period of the signal s3 is the reference period (p) and a width thereof is the reference width (w), the MCU 21 may diagnose that the communication state between the vehicle 10 and the BMS 20 and the battery state are normal.

Figure 3A:
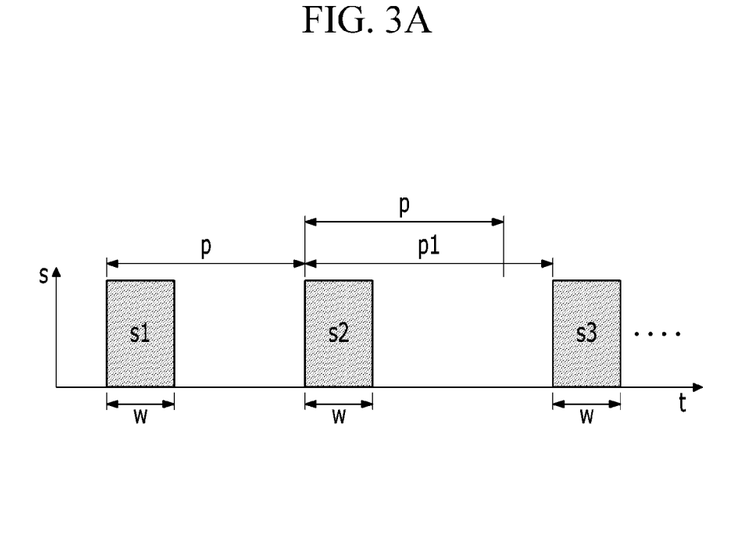
FIG. 3A and FIG. 3B illustrate signals that may be diagnosed in a first state according to an embodiment.
Figure 3B:
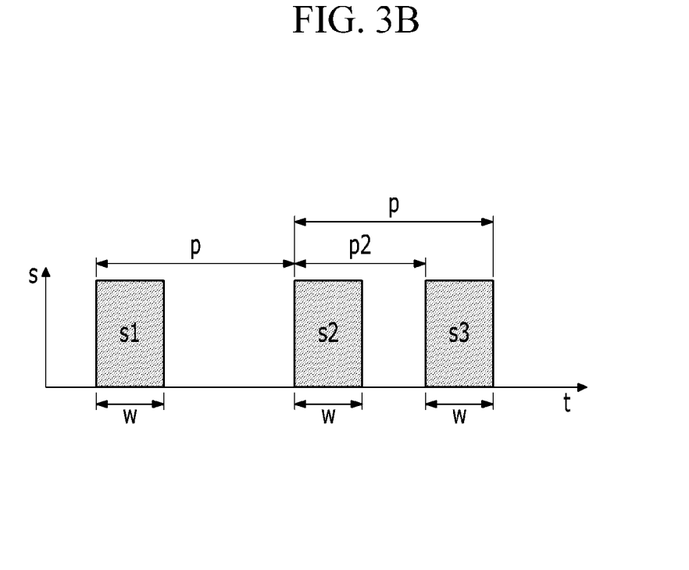

Referring to FIG. 3A, the width of the signal s3 is the reference width (w), and the period thereof is a period p1 that is longer than the reference period (p), and referring to FIG. 3B, the width of the signal s3 is the reference width (w), and the period thereof is a period p2 that is shorter than the reference period (p).

The MCU 21 may diagnose a case in which the signal s3 has the reference width (w) and the period p1 (for example, greater than 700 ms) that is longer than the reference period (p) and/or the reference width (w) and the period p2 (for example, less than 300 ms) that is shorter than the reference period (p), as the first state.

The first state may mean a state in which communication between the vehicle 10 and the BMS 20 is disconnected or an abnormal communication state, or a state in which a communication line between the vehicle 10 and the BMS 20 is abnormal, but is not limited thereto.

Figure 4A:
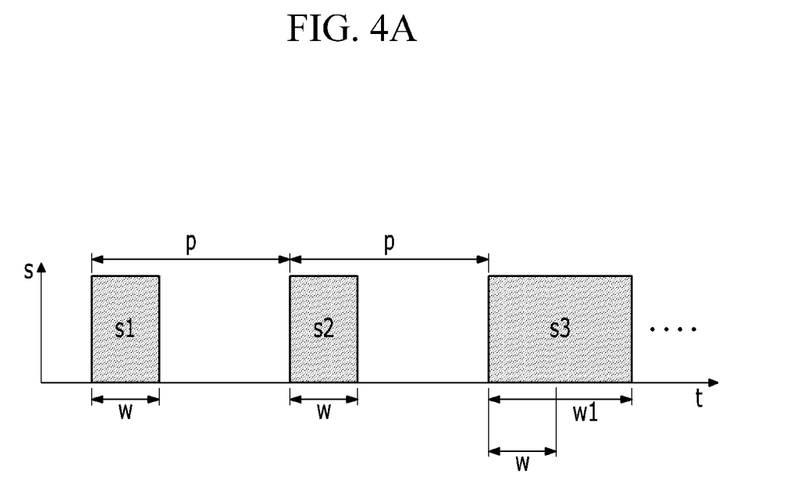
FIG. 4A to FIG. 4C illustrate signals that may be diagnosed in a second state according to an embodiment.
Figure 4B:
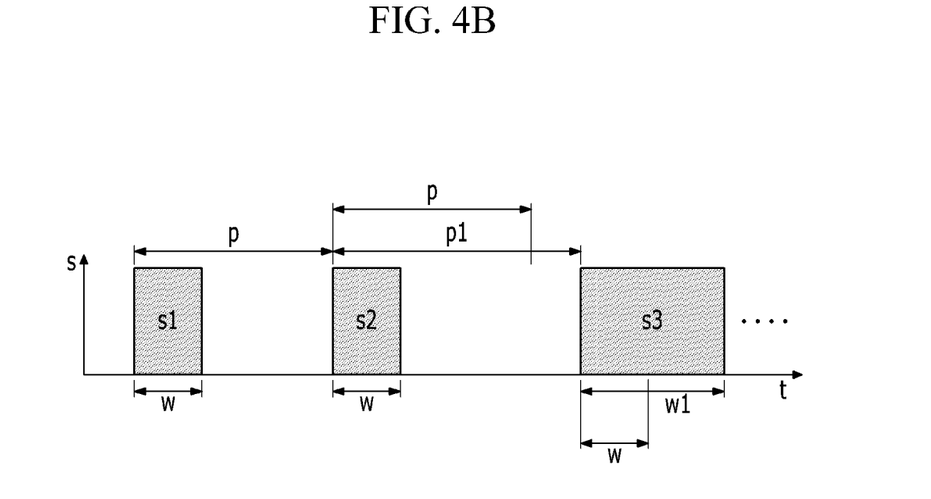

Referring to FIG. 4A, the signal s3 has the reference period (p) and a width w1 (for example, greater than 150 ms) that is wider than the reference width (w), and referring to FIG. 4B, the signal s3 has the period p1 (for example, greater than 700 ms) that is longer than the reference period (p) and the width w1 that is wider than the reference width (w). In addition, referring to FIG. 4C, the signal s3 has a period p2 (for example, less than 300 ms) that is shorter than the reference period p and the width w1 that is wider than the reference width w.

Figure 4C:
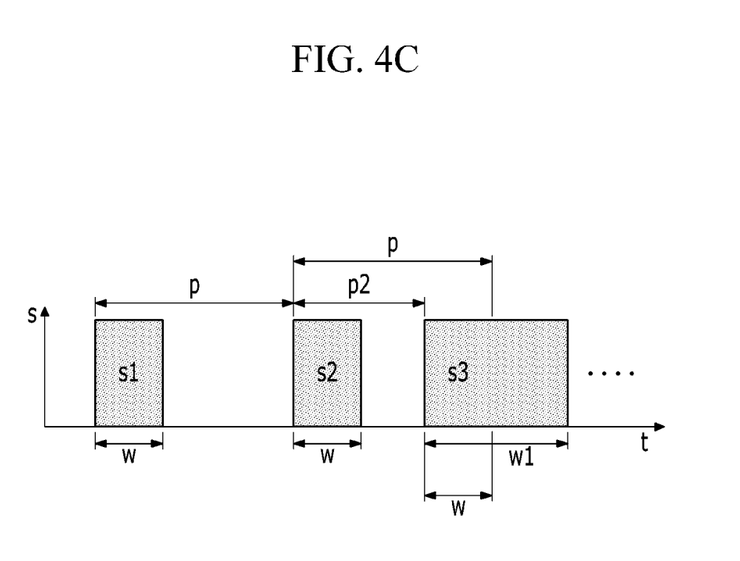

The MCU 21 may diagnose a case in which the signal s3 has the width w1 and/or the signal s3 has the width w1 and the period p1 or p2, as the second state. That is, the MCU 21 may diagnose the battery as the second state when the width of the signal s3 is the width w1, or may diagnose the battery as the second state when the width of the signal s3 is the width w1 and the period thereof is the period p1 or p2.

The second state means a state in which the signal (s) is abnormally high (for example, 5 V or more), and the MCU 21 may diagnose a short-to-battery state based on the signal s3.

Figure 5A:
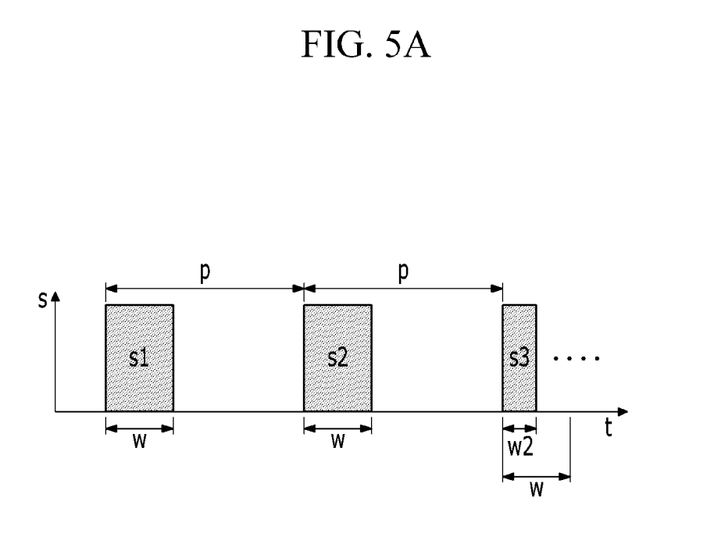
FIG. 5A to FIG. 5C illustrate signals that may be diagnosed in a third state according to an embodiment.
Figure 5B:
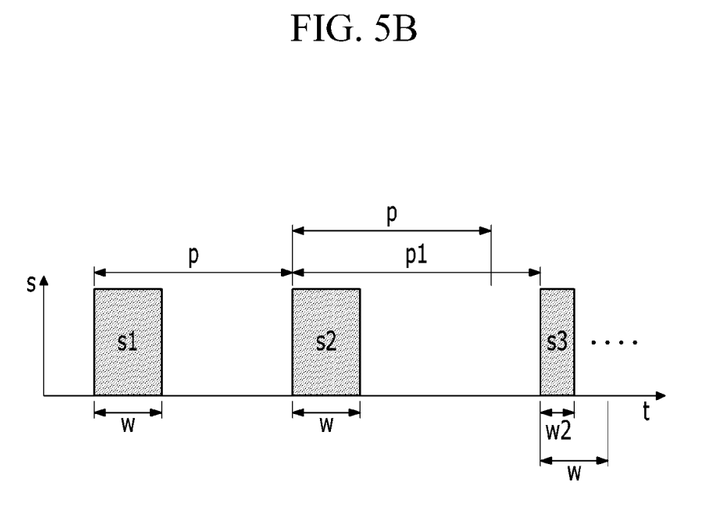

Referring to FIG. 5A, the signal s3 has the reference period p and the width w2 (for example, less than 50 ms) that is shorter than the reference period (w). Referring to FIG. 5B, the signal s3 has the period p1 that is longer than the reference period (p) and the width w2 that is narrower than the reference width (w). In addition, referring to FIG. 5C, the signal s3 has the period p2 that is shorter than the reference period (p) and the width w2 that is narrower than the reference width (w).

Figure 5C:
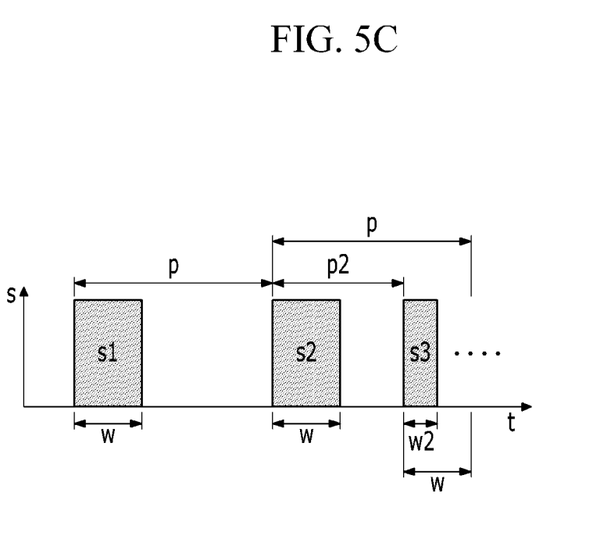

The MCU 21 may diagnose a case in which the signal s3 has the width w2 and/or the signal s3 has the width w2 and the period p1 or p2, as the third state. That is, the MCU 21 may diagnose the battery as the third state when the width of the signal s3 is the width w2, or may diagnose the battery as the third state when the width of the signal s3 is the width w2 and the period thereof is the period p1 or p2.

The third state means a state in which the signal (s) is abnormally low (for example 0.3 V or less), and the MCU 21 may diagnose a short-to-ground state of the battery based on the signal s3.

In the above, for convenience of description, the vehicle 10 and the BMS 20 are described as separate components, but the BMS 20 may be included in the vehicle 10, and is not limited thereto. In addition, the above-described normal state, and the first to third states are not independent states, but instead, at least one or more of the normal state and the first to third states may exist sequentially or separately.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the above-detailed description is not to be interpreted as being restrictive, but is to be considered as being illustrative. The scope of the present invention is to be determined by reasonable interpretation of the claims, and all alterations within equivalences of the present invention fall within the scope of the present invention.

The invention claimed is:

1. A diagnosis apparatus for diagnosing a communication state between a vehicle including a battery and a battery management system (BMS) connected to the vehicle, wherein the diagnosis apparatus is included in the BMS and comprises:
   a controller configured to:
      receive, from the vehicle, a signal;
      compare a period of the received signal to a predetermined reference period;

compare a width of the received signal to a predetermined reference width; and determine a communication state and a state of the battery based on the compared period and width of the signal, wherein, in response to the period of the signal being the same as the reference period and the width of the signal being the same as a reference width, the controller is configured to determine the communication state to be a normal communication state and the state of the battery to be a normal battery state.

2. The diagnosis apparatus of claim 1, wherein
in response to the width of the signal being the same as the reference width and the period of the signal being not the same as the reference period, the controller is configured to determine the communication state to be a disconnected communication state in which communication between the vehicle and the BMS is disconnected.

3. The diagnosis apparatus of claim 2, wherein
in response to the width of the signal being the same as the reference width and the period of the signal being longer that the reference period, the controller is configured to determine the communication state to be the disconnected communication state.

4. The diagnosis apparatus of claim 2, wherein
in response to the width of the signal being the same as the reference width and the period of the signal being shorter that the reference period, the controller is configured to determine the communication state to be the disconnected communication state.

5. The diagnosis apparatus of claim 1, wherein
in response to the width of the signal being wider than the reference width and the period of the signal being the same as the reference period, the controller is configured to determine the state of the battery to be a short-to-battery state.

6. The diagnosis apparatus of claim 1, wherein
in response to the width of the signal being wider than the reference width and the period of the signal being longer than the reference period, the controller is configured to determine the state of the battery to be a short-to-battery state.

7. The diagnosis apparatus of claim 1, wherein
in response to the width of the signal being wider than the reference width and the period of the signal being shorter than the reference period, the controller is configured to determine the state of the battery to be a short-to-battery state.

8. The diagnosis apparatus of claim 1, wherein
in response to the width of the signal being narrower than the reference width and the period of the signal being the same as the reference period, the controller is configured to determine the state of the battery to be a short-to-ground state.

9. The diagnosis apparatus of claim 1, wherein
in response to the width of the signal is narrower than the reference width and the period of the signal is longer than the reference period, the controller is configured to determine the state of the battery to be a short-to-ground state.

10. The diagnosis apparatus of claim 1, wherein
in response to the width of the signal is narrower than the reference width and the period of the signal is shorter than the reference period, the controller is configured to determine the state of the battery to be a short-to-ground state.

11. The diagnosis apparatus of claim 1, wherein the signal is a universal asynchronous receiver/transmitter (UART) signal.

12. A diagnosis system comprising:
the diagnosis apparatus of claim 1; and
a BMS, wherein the diagnosis apparatus is included in the BMS.

13. The diagnosis system of claim 12, wherein the BMS further comprises:
a comparator connected to an output terminal of the vehicle to receive the signal and to an input terminal of the controller to transmit the signal, wherein an output of the comparator is held at a reference voltage through a first pull-up resistor, a negative input electrode of the comparator is held at the reference voltage through a second pull-up resistor and connected to ground through a third resistor, and a positive input electrode of the comparator is held at the reference voltage through a fourth pull-up resistor.

14. The diagnosis system of claim 13, wherein the BMS further comprises:
a filter connected between the output terminal of the vehicle and the positive input electrode of the comparator.

15. The diagnosis apparatus of claim 14, wherein the filter includes:
a fifth resistor; and
a capacitor connected to ground,
wherein the filter is configured to remove noise from the signal.

16. A system comprising:
a vehicle including a battery; and
the diagnosis system of claim 12, wherein the BMS of the diagnosis system is connected to the vehicle.

* * * * *